(12) United States Patent
Kao

(10) Patent No.: US 9,070,602 B2
(45) Date of Patent: Jun. 30, 2015

(54) METHOD FOR FABRICATING LIQUID CRYSTAL DISPLAY

(71) Applicant: Ye Xin Technology Consulting Co., Ltd., Hsinchu (TW)

(72) Inventor: Yi-Chun Kao, Hsinchu (TW)

(73) Assignee: Ye Xin Technology Consulting Co., Ltd., Hsinchu (TW)

( * ) Notice: Subject to any disclaimer, the term of this patent is extended or adjusted under 35 U.S.C. 154(b) by 0 days.

(21) Appl. No.: 14/297,601

(22) Filed: Jun. 5, 2014

(65) Prior Publication Data
US 2014/0363914 A1 Dec. 11, 2014

(30) Foreign Application Priority Data

Jun. 6, 2013 (TW) .............................. 102120211 A

(51) Int. Cl.
*G02F 1/1343* (2006.01)
*H01L 27/12* (2006.01)
*H01L 21/28* (2006.01)
*G02F 1/1345* (2006.01)

(52) U.S. Cl.
CPC ...... *H01L 27/1259* (2013.01); *H01L 21/28247* (2013.01); *G02F 1/13452* (2013.01)

(58) Field of Classification Search
CPC ................... G02F 1/13452; H01L 21/28247; H01L 27/1259
USPC ........................................ 430/318, 319, 321
See application file for complete search history.

(56) References Cited

U.S. PATENT DOCUMENTS

2010/0101839 A1* 4/2010 Saran et al. .................. 174/256

OTHER PUBLICATIONS

Hu et al. "Scalable Coating and Properties of Transparent, Flexible, Silver Nanowire Electrodes", ACSNANO, vol. 4, No. 5, pp. 2955-2963 (Apr. 2010).*

* cited by examiner

*Primary Examiner* — John A McPherson
(74) *Attorney, Agent, or Firm* — Novak Druce Connolly Bove + Quigg LLP

(57) ABSTRACT

Method for manufacturing a thin film transistor liquid crystal display is provided. A substrate is provided. A gate electrode, a source electrode, a drain electrode, and a passivation film are formed on the substrate in sequence. The passivation film has a contact hole to expose a part of the drain electrode. A conductive layer is formed by coating nano metal material on the passivation film and in the contract hole from which the drain electrode is exposed. A pixel electrode is formed by patterning the conductive layer.

11 Claims, 6 Drawing Sheets

METHOD FOR FABRICATING LIQUID CRYSTAL DISPLAY

FIELD

The present disclosure relates to methods for fabricating a liquid crystal display (LCD) and, particularly to a method for fabricating a pixel electrode of a thin film transistor liquid crystal display (TFT LCD).

BACKGROUND

A thin film transistor liquid crystal display in the current market is being developed mainly focusing on high contrast ratio, no grayscale inversion, high brightness, high color saturation, fast response and wide-viewing angle.

A traditional method for fabricating a liquid crystal display includes preparing an insulating substrate defining a TFT region of a pixel portion, forming an active layer on the substrate to cover the TFT region of the pixel region, forming a gate electrode of the pixel portion on the active layer, forming a source region of the pixel portion and a drain region of the pixel portion in the active layer at both sides of the gate electrode of the pixel portion, forming a passivation film having first and second contact holes on the substrate having the drain region of the pixel portion, the first and second contact holes respectively exposing the source region of the pixel portion and the drain region of the pixel portion, sequentially forming a transparent conductive film and a metal film on the passivation film; and selectively etching the metal film and the transparent conductive film to form a source electrode pattern of the pixel portion/a source electrode of the pixel portion, which are sequentially deposited to cover the first contact hole, and a drain electrode pattern of the pixel portion/a drain electrode of the pixel portion, which are sequentially deposited to cover the second contact hole.

BRIEF DESCRIPTION OF THE DRAWINGS

The components of the drawings are not necessarily drawn to scale, the emphasis instead being placed upon clearly illustrating the principles of the embodiments of the display device. Moreover, in the drawings, like reference numerals designate corresponding parts throughout several views.

DETAILED DESCRIPTION

Figure 1:
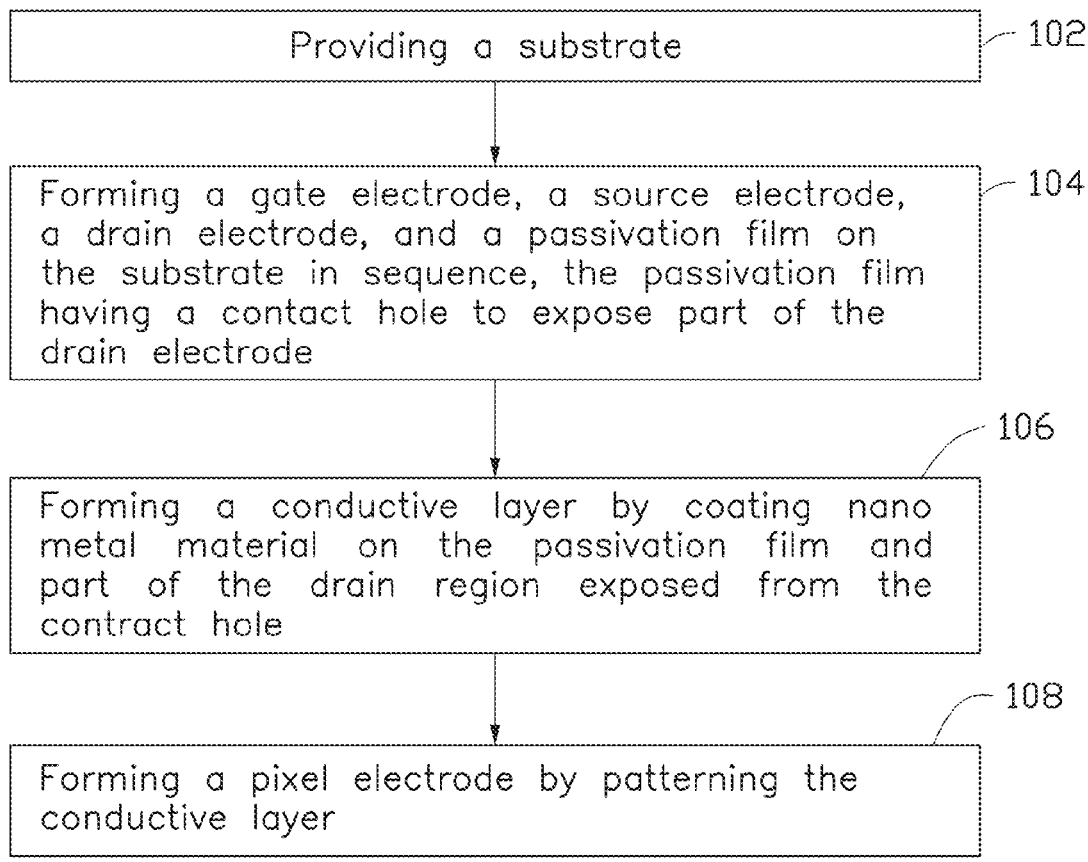
FIG. 1 is a flow chart of a method for manufacturing a liquid crystal display in accordance with an exemplary embodiment of the present disclosure.

Referring to FIG. 1, a flow chart of a method of fabricating a liquid crystal display in accordance with an exemplary embodiment of the present disclosure is shown. The method can include:

providing a substrate (block 102);

forming a gate electrode, a source electrode, a drain electrode, and a passivation film on the substrate in sequence, the passivation film having a contact hole to expose a part of the drain electrode (block 104);

forming a conductive layer by coating nano metal material on the passivation film and part of the drain region exposed from the contract hole (block 106); and forming a pixel electrode by patterning the conductive layer (block 108).

Figure 2:
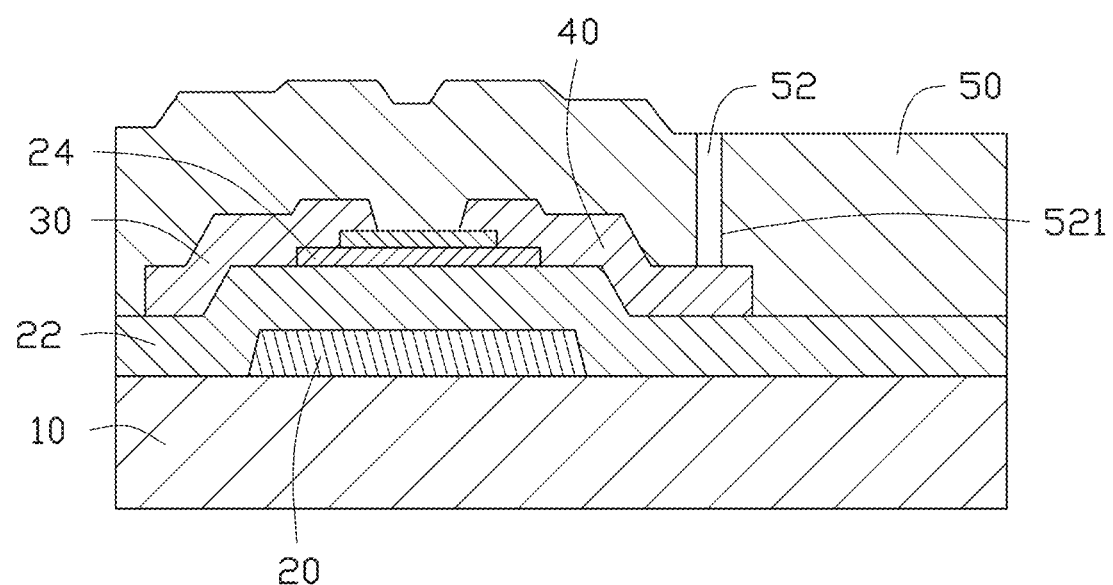
FIGS. 2-5 are cross sections of the liquid crystal display fabricated by the method of FIG. 1.

Also referring to FIG. 2, a substrate 10 is provided. The substrate 10 may be made of glass, silicon or ceramic. In the present embodiment, the substrate 10 is made of glass.

A gate electrode 20, a source electrode 30, a drain electrode 40, and a passivation film 50 are formed via four photo-mask processes over the substrate 10. A first photo-mask process is performed to form the gate electrode 20. In the first photo-mask process, a gate metal layer and a first photo-resist layer are formed on the substrate 10 in sequence. A predetermined pattern according to the first mask is appeared on the first photo-resist layer after an exposure and development process. The gate electrode 20 is then formed by etching the gate metal layer according to the predetermined pattern of the first photo-resist layer. Then the first photo-resist layer is removed.

A second photo-mask process is performed to form a semiconductor layer 24. In the second photo-mask process, a gate insulating layer 22, an amorphous silicon layer and a second photo-resist layer are formed on the substrate 10 and the gate electrode 20 in sequence. A predetermined pattern according to the second mask is appeared on the second photo-resist layer after an exposure and development process. The patterned semiconductor layer 24 is then formed by etching the amorphous silicon layer according to the predetermined pattern of the second photo-resist layer. Then the second photo-resist layer is removed.

A third photo-mask process is performed to form the source electrode 30 and the drain electrode 40. In the third photo-mask process, a source/drain metal layer and a third photo-resist layer are formed on the gate insulating layer 22 and the semiconductor layer 24 in sequence. A predetermined pattern according to the third mask is appeared on the third photo-resist layer after an exposure and development process. The patterned source electrode 30 and the drain electrode 40 are then formed by etching the source/drain metal layer according to the predetermined pattern of the third photo-resist layer. Then the third photo-resist layer is removed.

A fourth photo-mask process is performed to form the passivation film 50. In the fourth photo-mask process, a passivation layer and a fourth photo-resist layer are formed on the gate electrode 20, the source electrode 30 and the drain electrode 40 in sequence. A predetermined pattern according to the fourth mask is appeared on the fourth photo-resist layer after an exposure and development process. The patterned passivation film 50 is then formed by etching the passivation layer according to the predetermined pattern of the fourth photo-resist layer. Then the fourth photo-resist layer is removed. In the fourth photo-mask process, a part 521 of the passivation film 50 which has a predetermined pattern is on the drain electrode 40. In the embodiment, the predetermined pattern includes a contract hole 52 communicating with the drain electrode 40.

Figure 3:
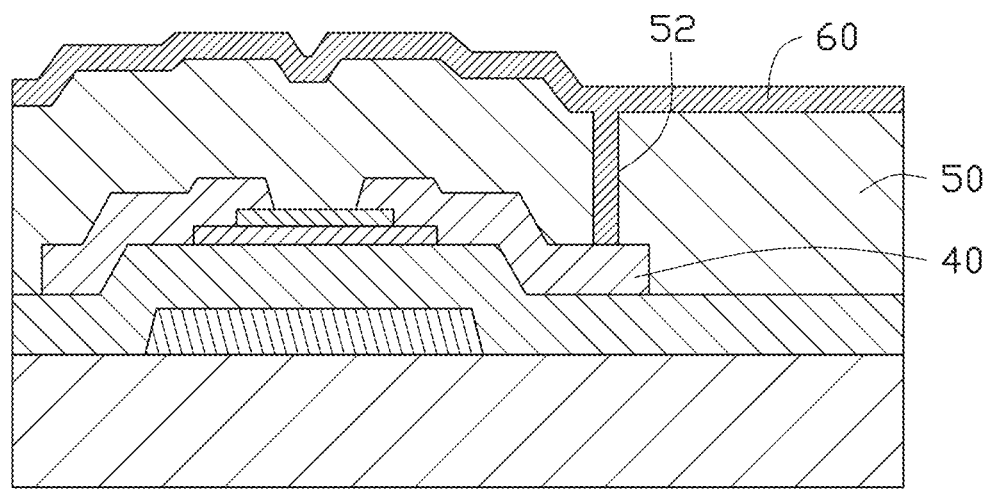
Figure 6:
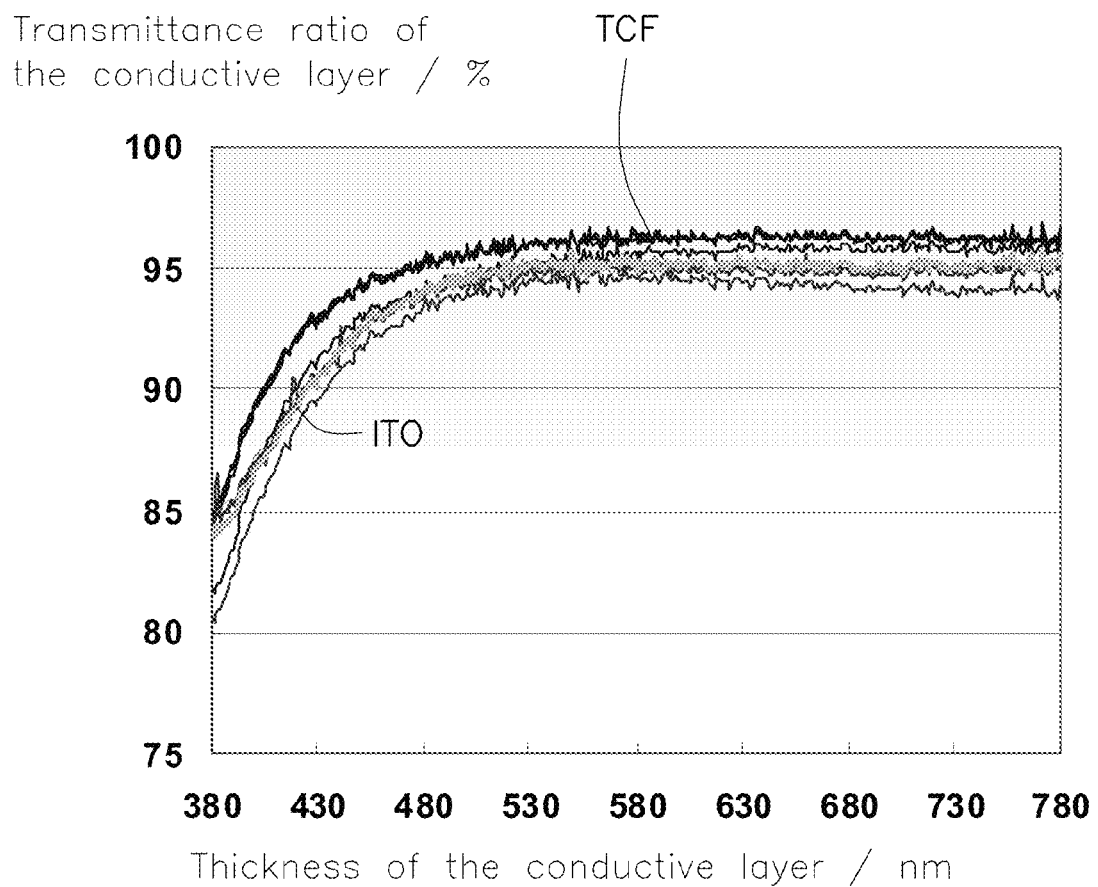
FIG. 6 is a coordinate graph showing transmittance ratios of a conductive layer which is made of nano-particles or nano-wires in the present disclosure and a traditional conductive layer which is made of indium tin oxides (ITO).

Referring to FIG. 3, nano metal material is prepared which is used for forming a conductive layer 60. The nano metal material can be nano particles or nano wires made of silver or copper. The nano particles or nano wires have a dimension between 1 nanometer to 50 nanometers. The nano metal materiel has excellent flexibility. When the nano metal materiel is coated on a rough and chamfered surface of the passivation film 50, a continuous and seamless surface without any crack can be obtained on the passivation film 50. In other words, the conductive layer 60 is not ruptured at the position of the contact hole 52 of the passivation film 50. A poor conductive layer which has chapped films will be avoided. Furthermore, transmittance ratio of the conductive layer 60 is higher when the conductive layer 60 is made of nano particles or nano wires (as indicated by TCF in FIG. 6) than that is made of ITO (as indicated by ITO in FIG. 6).

Figure 4:
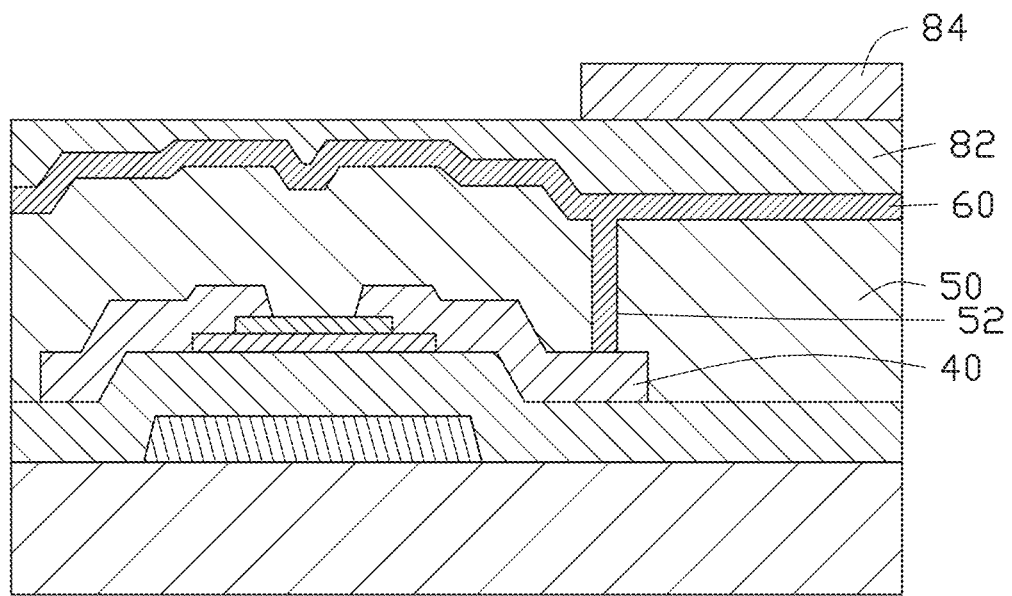
Figure 5:
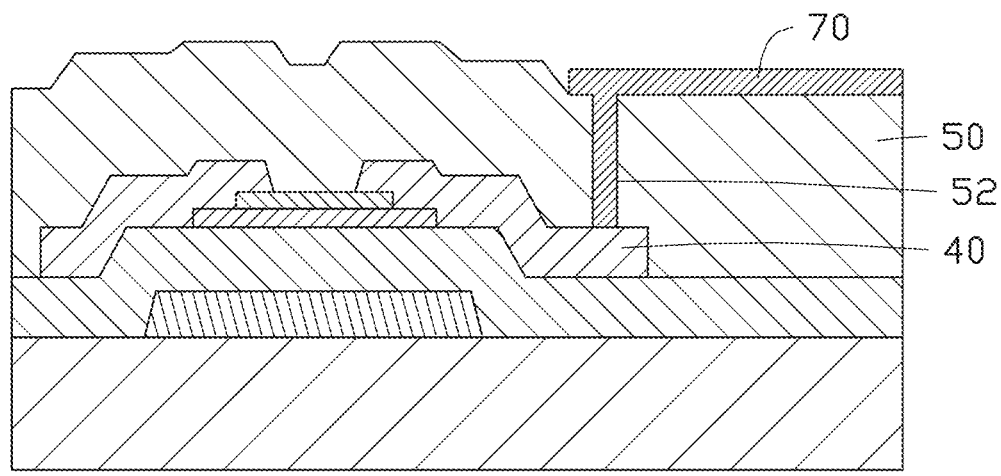

Referring to FIG. 4 and FIG. 5, a fifth photo-mask process is performed to form the pixel electrode 70. In the fifth photo-mask process, the fifth mask 84 and the fifth photo-resist layer 82 cover the conductive layer 60. A predetermined pattern according to the fifth mask 84 is appeared on the fifth photo-resist layer 82 after an exposure and development process. The pixel electrode 70 is then formed by etching the conductive layer 60 according to the predetermined pattern. Then the fifth photo-resist layer 82 and the fifth mask 84 are removed.

A plurality of supplementary steps can be performed after the above four steps:

plating the pixel electrode 70;

forming a covering film (not shown) on the pixel electrode 70; and baking the pixel electrode 70.

The step of plating the pixel electrode 70 can flat a surface of the pixel electrode 70, thereby making a good contact with other components. The covering film can be an organic film coated on both of the pixel electrode 70 and the passivation film 50 to make the pixel electrode 70 adhere on the passivation film 50 firmly. The step of baking the pixel electrode 70 can be lasted for at least one hour and under a temperature of at least 180 degrees Celsius.

It is to be further understood that even though numerous characteristics and advantages have been set forth in the foregoing description of the embodiment(s), together with details of the structures and functions of the embodiment(s), the disclosure is illustrative only; and that changes may be made in detail, especially in the matters of shape, size, and arrangement of parts within the principles of the disclosure to the full extent indicated by the broad general meaning of the terms in which the appended claims are expressed.

What is claimed is:

1. A method for fabricating a thin film transistor (TFT) liquid crystal display, the method comprising:

providing a substrate;

forming a gate electrode, a source electrode, a drain electrode, and a passivation film on the substrate in sequence, the passivation film having a contact hole to expose a part of the drain electrode;

forming a conductive layer by coating nano metal material on the passivation film and the part of the drain electrode exposed from the contract hole;

forming a pixel electrode by patterning the conductive layer; and plating the pixel electrode for flatting a surface of the pixel electrode.

2. The method of claim 1, wherein the nano metal materiel is nano particles or nano wires.

3. The method of claim 2, wherein the nano metal materiel is made of silver or copper.

4. The method of claim 2, wherein the nano particles or nano wires each have a dimension between 1 nanometer to 50 nanometers.

5. The method of claim 1, wherein the gate electrode, the source electrode, the drain electrode, and the passivation film on the substrate are performed via independent photo-mask processes, respectively.

6. The method of claim 1, wherein the step of forming a pixel electrode is performed by a photo-mask process, in which a fifth mask and a fifth photo-resist layer are provided for covering the conductive layer.

7. The method of claim 6, wherein a predetermined pattern according to the fifth mask is formed on the fifth photo-resist layer after an exposure and development process.

8. The method of claim 7, wherein the pixel electrode is formed by etching the conductive layer according to the predetermined pattern.

9. The method of claim 1, wherein a plurality of supplementary steps are performed after the step of plating the pixel electrode for flatting a surface of the pixel electrode, the supplementary steps comprising:

forming a covering film on the pixel electrode; and baking the pixel electrode.

10. The method of claim 9, wherein the covering film is an organic film coated on both of the pixel electrode and the passivation film.

11. The method of claim 9, wherein the step of baking the pixel electrode is lasted for at least one hour and under a temperature of at least 180 degrees Celsius.

* * * * *